US009537029B2

(12) United States Patent
Kim et al.

(10) Patent No.: US 9,537,029 B2
(45) Date of Patent: Jan. 3, 2017

(54) SEMICONDUCTOR DEVICE WITH AN EPITAXIAL LAYER AND METHOD OF FABRICATING THE SAME

(71) Applicant: SAMSUNG ELECTRONICS CO., LTD., Suwon-si, Gyeonggi-do (KR)

(72) Inventors: Beom Seok Kim, Seoul (KR); Bongjin Kuh, Suwon-si (KR); Jongsung Lim, Seoul (KR); Hanmei Choi, Seoul (KR)

(73) Assignee: SAMSUNG ELECTRONICS CO., LTD, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/582,294

(22) Filed: Dec. 24, 2014

(65) Prior Publication Data
US 2015/0255649 A1 Sep. 10, 2015

(30) Foreign Application Priority Data
Mar. 5, 2014 (KR) .......................... 10-2014-0026139

(51) Int. Cl.
*H01L 21/02* (2006.01)
*H01L 31/0352* (2006.01)
*H01L 31/18* (2006.01)

(52) U.S. Cl.
CPC ..... *H01L 31/03529* (2013.01); *H01L 31/1804* (2013.01); *H01L 31/1864* (2013.01); *Y02P 70/521* (2015.11)

(58) Field of Classification Search
CPC ........................ H01L 21/02381; H01L 21/0254
USPC ........................... 257/190, 466, 618; 438/494
See application file for complete search history.

(56) References Cited

U.S. PATENT DOCUMENTS

| 6,835,970 B2 * | 12/2004 | Nam ................. H01L 21/76897 257/202 |
| 6,982,217 B2 * | 1/2006 | Imada ....................... B81B 1/00 257/9 |
| 7,749,817 B2 | 7/2010 | Kermarec et al. |
| 8,173,551 B2 | 5/2012 | Bai et al. |

(Continued)

FOREIGN PATENT DOCUMENTS

JP 2007-123852 A 5/2007

OTHER PUBLICATIONS

Park et al, "Defect Reduction of Selective Ge Epitaxy in Trenches on Si(001) Substrates using Aspect Ratio Trapping", Applied Physics Letters 90, 2007 American Institute of Physics, pp. 052113-1-052113-3.

(Continued)

*Primary Examiner* — Jami M Valentine
(74) *Attorney, Agent, or Firm* — Lee & Morse P.C.

(57) ABSTRACT

A semiconductor device includes a first semiconductor layer including a recess region and protrusions defined by the recessed region, first insulating patterns provided on the protrusions and extending to sidewalls of the protrusions, and a second semiconductor layer to fill the recess region and cover the first insulating patterns. The protrusions includes a first group of protrusions spaced apart from each other in a first direction to constitute a row and a second group of protrusions spaced from the first group of protrusions in a second direction intersecting the first direction and spaced from each other in the first direction to constitute a row. The second group of protrusions are shifted from the first group of protrusions in the first direction.

19 Claims, 10 Drawing Sheets

(56) References Cited

U.S. PATENT DOCUMENTS

| | | |
|---|---|---|
| 8,253,211 B2 | 8/2012 | Cheng et al. |
| 8,324,660 B2 | 12/2012 | Lochtefeld et al. |
| 2004/0027675 A1* | 2/2004 | Wu ........................ B82Y 30/00 359/619 |
| 2005/0179130 A1* | 8/2005 | Tanaka ................ H01L 21/0237 257/730 |
| 2007/0099329 A1 | 5/2007 | Maa et al. |
| 2009/0298214 A1 | 12/2009 | Paek et al. |
| 2011/0017971 A1* | 1/2011 | Kim .................. H01L 27/10876 257/5 |
| 2011/0079704 A1* | 4/2011 | Yu ..................... H01L 27/14607 250/208.1 |
| 2011/0147870 A1 | 6/2011 | Ang et al. |
| 2011/0315988 A1* | 12/2011 | Yu .......................... H01L 27/14 257/52 |
| 2012/0153124 A1* | 6/2012 | Yu ..................... H01L 27/14607 250/208.1 |
| 2012/0168823 A1 | 7/2012 | Luo et al. |
| 2013/0037857 A1 | 2/2013 | Von Kanel et al. |
| 2013/0115721 A1 | 5/2013 | Clark |
| 2013/0134309 A1* | 5/2013 | Rapaport .............. G02F 1/3556 250/330 |

OTHER PUBLICATIONS

Bai et al., "Study of the Defect Elimination Mechanisms in Aspect Ratio Trapping Ge Growth", Applied Physics Letter 90, 2007 American Institute of Physics, pp. 101902-1-101902-3.

* cited by examiner

SEMICONDUCTOR DEVICE WITH AN EPITAXIAL LAYER AND METHOD OF FABRICATING THE SAME

CROSS-REFERENCE TO RELATED APPLICATION

This patent application claims priority under 35 USC §119 to Korean Patent Application No. 10-2014-0026139, filed on Mar. 5, 2014, the entirety of which is hereby incorporated by reference.

TECHNICAL FIELD

Embodiments relate to semiconductor memory devices and methods of fabricating the same and, more particularly, to a semiconductor device including an epitaxial layer and a method of fabricating the same.

BACKGROUND OF THE RELATED ART

Due to characteristics such as miniaturization, multi-functionality, and/or low manufacturing cost, semiconductor devices are getting the spotlight as important elements in electronic industry. Exemplarily, silicon has been used as a basic material due to its economic feasibility and superior characteristics. However, it is necessary to simultaneously use various semiconductor materials other than silicon. Epitaxial growth is a type of a process for forming a semiconductor layer and may assure a layer with less crystal defect. The epitaxial growth is used to stack heterogeneous or homogeneous semiconductor layers.

SUMMARY

Embodiments may provide a structure including a semiconductor layer with reduced crystal defect and a method of fabricating the structure.

A semiconductor device according to some embodiments may include a first semiconductor layer including a recess region and protrusions defined by the recessed region; first insulating patterns provided on the protrusions and extending to sidewalls of the protrusions; and a second semiconductor layer to fill the recess region and cover the first insulating patterns. The protrusions may include a first group of protrusions spaced apart from each other in a first direction to constitute a row; and a second group of protrusions spaced from the first group of protrusions in a second direction intersecting the first direction and spaced from each other in the first direction to constitute a row. The second group of protrusions may be shifted from the first group of protrusions in the first direction.

In some embodiments, the protrusions may be arranged to constitute a plurality of rows and columns when viewed from the top. The protrusions of adjacent rows may be offset in a direction.

In some embodiments, a height from a lowermost surface of the first insulating layer to a top surface of the first insulating pattern may be greater than distance between the first insulating patterns adjacent in the first direction.

In some embodiments, the semiconductor device may further include second insulating patterns provided between top surfaces of the protrusions and the first insulating patterns. The second insulating patterns may include a different material than the first insulating patterns.

In some embodiments, each of the protrusions comprises a pillar.

In some embodiments, the second semiconductor layer may have a lattice constant difference of one (1) percent from the first semiconductor layer.

In some embodiments, the second semiconductor layer may include a first portion to fill the recess region and a second portion provided at a higher level than the first insulating patterns.

A method of forming a semiconductor device according to some embodiments may include forming a recess region in a first semiconductor layer to define protrusions, forming first insulating patterns on the protrusions, the first insulating patterns extending to sidewalls of the protrusions, and forming a second semiconductor layer to fill the recess region and cover the first insulating patterns. Forming the second semiconductor layer may include forming a first region to fill the recess region and top surfaces of the first insulating patterns, performing an annealing process after formation of the first region, and forming a second region on the first region subjected to the annealing process.

In some embodiments, the protrusions may include a first group of protrusions spaced apart from each other in a first direction to constitute a row, and a second group of protrusions spaced from the first group of protrusions in a second direction intersecting the first direction and spaced from each other in the first direction to constitute a row. The second group of protrusions may be shifted from the first group of protrusions in the first direction.

In some embodiments, the protrusions may be arranged to constitute a plurality of rows and columns when viewed from the top. The protrusions of adjacent rows may be arranged in a zigzag form.

In some embodiments, the first region may be formed by performing a selective epitaxial growth process using the first semiconductor layer exposed between the first insulating patterns as a seed layer. The second region may be formed by performing an epitaxial growth process using the first region as a seed layer.

In some embodiments, the method may further include forming second insulating patterns between top surfaces of the protrusions and the first insulating patterns. Forming the recess region may include forming the second insulating patterns on the first semiconductor layer, and performing an anisotropic etch process using the second insulating patterns as an etch mask. The second insulating patterns may include a different material than the first insulating patterns.

An optical detector according to some embodiments may include a substrate, an interlayer insulating pattern provided on the substrate and having a groove to expose the substrate, first insulating patterns provided on the substrate in the groove, and an optical absorption layer provided on the first insulating patterns and filling the groove. The first insulating patterns may include a first group of first insulating patterns spaced apart from each other in a first direction to constitute a row, and a second group of first insulating patterns spaced from the first group of first insulating patterns in a second direction intersecting the first direction and spaced from each other in the first direction to constitute a row. The second group of first insulating patterns may be shifted from the first group of first insulating patterns in the first direction.

In some embodiments, the first insulating patterns may be arranged to constitute a plurality of rows and columns when viewed from the top. The first insulating patterns of adjacent rows may be arranged in a zigzag form.

In some embodiments, the substrate may further include a recess region and protrusions defined by the recessed region. The first insulating patterns may be provided on the protrusions and extend to sidewalls of the protrusions.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION

Figure 1:
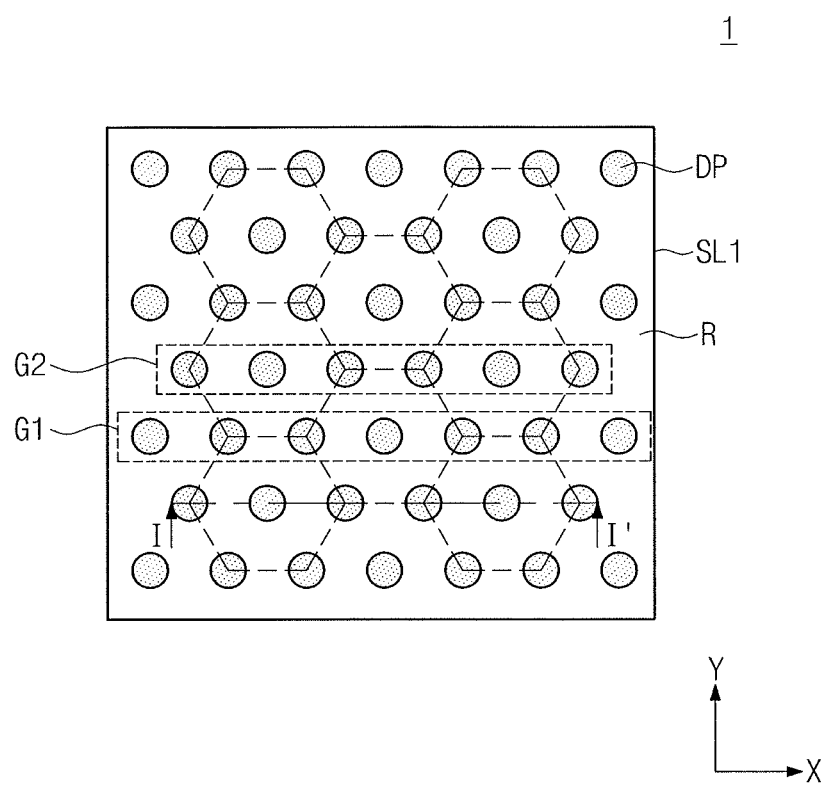
FIG. 1 is a plan view of a semiconductor device according to an embodiment.

The advantages and features of the embodiments will be apparent from the exemplary implementations described with reference to the accompanying drawings. It should be noted, however, that the embodiments are not limited, and may be implemented in various forms. Accordingly, the exemplary embodiments are provided only to disclose some examples and to let those skilled in the art understand the nature of the embodiments.

It will be understood that when an element is referred to as being "on" or "connected" or "coupled" to another element, it can be directly on or connected or coupled to the other element or intervening elements can be present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Exemplary embodiments will be described below with reference to various views, which are exemplary drawings that demonstrate aspects of the embodiments. The items, layers, structures and the like depicted in the exemplary drawings may be modified by manufacturing techniques and/or tolerances. Accordingly, the exemplary embodiments are not limited to specific configurations shown in the drawings, and include modifications based on the method of manufacturing the semiconductor device, for example.

Though terms like a first, a second, and a third are used to describe various elements in various embodiments, the elements are not limited to these terms. These terms are used only to tell one element from another element, but not to imply a required sequence of elements. For example, a first element can be termed a second element, and, similarly, a second element can be termed a first element, without departing from the scope of the embodiments. As used herein, the term "and/or" includes any and all combinations of one or more of the associated listed items.

The terms used in the present specification are used to describe a particular embodiment and are not used to limit. As in the present specification, a singular form may include a plural form unless the singular form definitely indicated otherwise in the context. Also, in the present specification, the terms "comprise" and/or "comprising" specify existence of shapes, numbers, steps, operations, members, elements, and/or groups thereof, which are referred to, and do not exclude existence or addition of one or more different shapes, numbers, operations, members, elements, and/or groups thereof.

Figure 2:
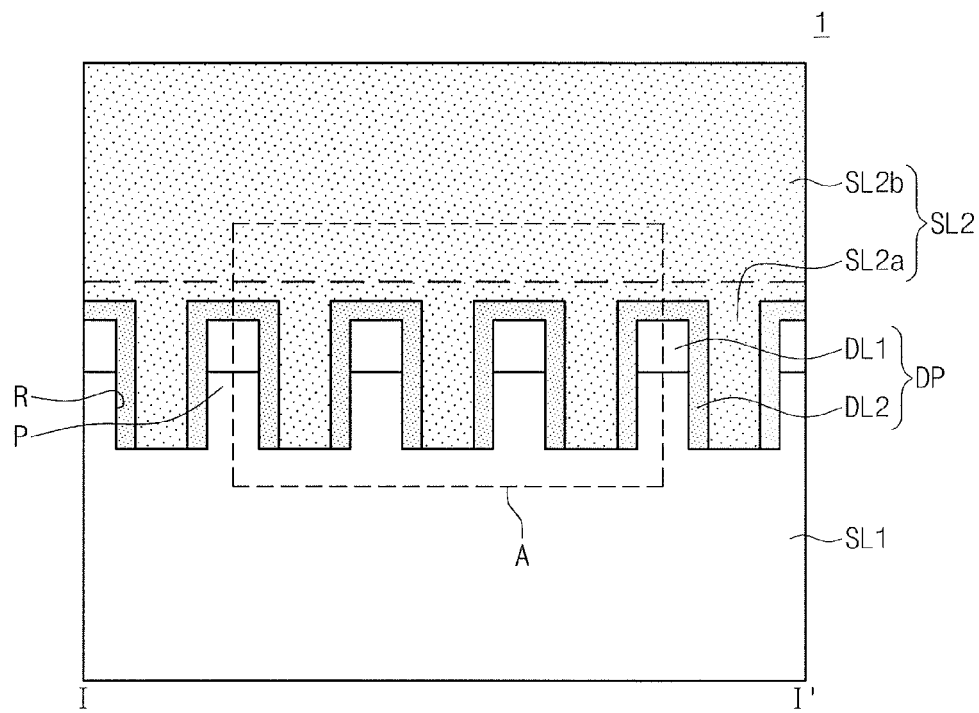
FIG. 2 is a cross-sectional view taken along the line I-I' in FIG. 1, which illustrates a semiconductor device according to an embodiment.
Figure 3:
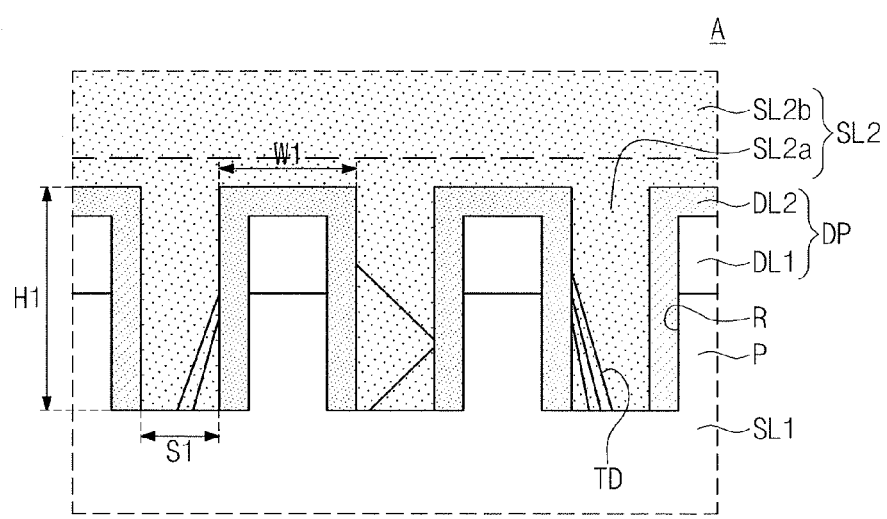
FIG. 3 is an enlarged view of a portion A in FIG. 2.
Figure 4:
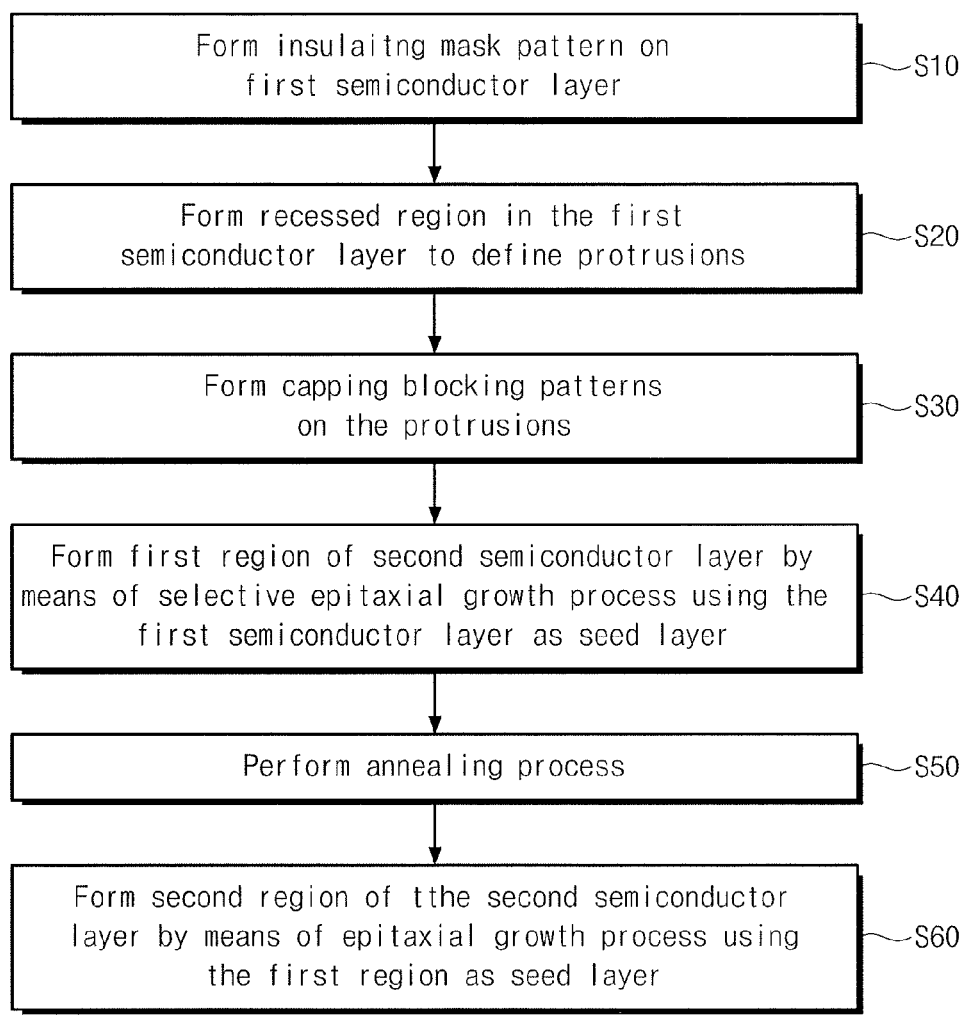
FIG. 4 is a flowchart showing a method of fabricating a semiconductor device according to an embodiment.

FIG. 1 is a plan view of a semiconductor device 1 according to an embodiment. FIG. 2 is a cross-sectional view taken along the line I-I' in FIG. 1. FIG. 3 is an enlarged view of a portion A in FIG. 2. FIG. 4 is a flowchart summarizing a method of fabricating the semiconductor device 1.

Referring to FIGS. 1 to 4, the semiconductor device 1 may include a first semiconductor layer SL1 and dislocation blocking patterns DP on the first semiconductor layer SL1.

The first semiconductor layer SL1 may include a IV group semiconductor material or a III-V group compound semiconductor material and may be an epitaxial layer growing from a substrate. The first semiconductor layer SL1 may have a recess region R and protrusions P defined by the recess region R. Each of the protrusions P may have, for example, a cylinder shape or a polygonal pillar shape.

The protrusions P may include a first group of protrusions G1 spaced apart from each other in a first direction (hereinafter referred to "x-direction") to constitute a row and a second group of protrusions G2 spaced apart from the first group in a second direction (hereinafter referred to as "y-direction") intersecting the x-direction. The second group of protrusions G2 may be spaced apart from each other in the x-direction to constitute a row and may be disposed to be shifted from the first group of protrusions G1 in the x-direction. The shifted distance may be half a pitch between the first group of protrusions G1. That is, when viewed in a plan view, the protrusions P may be disposed to constitute a plurality of rows and columns, and protrusions of adjacent rows may be arranged in a zigzag form in one direction. Accordingly, the protrusions P may be arranged in the form of a closed packed honeycomb. In this specification, the closed packed honeycomb indicates a structure where protrusions P are disposed in the centers and vertices of a plurality of hexagons to be densely arranged in the recess region R.

The dislocation blocking patterns DP may be provided on the protrusions P. The dislocation blocking patterns DP may cover top surfaces of the protrusions P and extend to sidewalls of the protrusions P. The dislocation blocking patterns DP may be arranged on the first semiconductor layer SL1 in the form of a closed packed honeycomb.

In an embodiment, the dislocation blocking patterns DP may include insulating mask patterns DL1 covering top surfaces of the protrusions P and capping blocking patterns DL2 on the insulating mask patterns DL1. The insulating mask patterns DL1 may have substantially the same sectional shape as the protrusions P. The capping blocking patterns DL2 may cover upper portions of the insulating mask patterns DL1 and may extend to sidewalls of the mask patterns DL1 and sidewalls of the protrusions P. In some embodiments, the insulating mask patterns DL1 may include the same material as the capping blocking patterns DL2. In other embodiments, the insulating mask patterns DL1 may include a different material than the capping blocking patterns DL2. For example, the insulating mask patterns DL1 and the capping blocking patterns DL2 may include oxide, nitride or oxynitride and may include the same material or different materials.

The dislocation blocking patterns DP may have constant height H1 and constant width W1 with respect to a distance S1 between the dislocation blocking patterns DP, as shown in FIG. 1. That is, an aspect ratio of the height H1 of the dislocation blocking pattern DP to the distance S1 between the dislocation blocking patterns DP may be at least greater than 1 to prevent threading dislocation (TD) during formation of a second semiconductor layer SL2 that will be explained below. For example, a ratio of the height H1 of the dislocation blocking pattern DP to the distance S1 between the dislocation blocking patterns DP may be between 1:1.1 and 1:4.4. In this case, a ratio of the width W1 of the dislocation blocking pattern DP to the distance S1 between the dislocation blocking patterns DP may be between 1:0.25 and 1:2.

The semiconductor layer SL2 may be provided on the first semiconductor layer SL1 to fill the recess region R and cover upper portions of the dislocation blocking patterns DP. The second semiconductor layer SL2 may be a different semiconductor material than the first semiconductor layer SL1. That is, the second semiconductor layer SL2 may include a IV group semiconductor material or a III-V group compound semiconductor material, and a difference between a lattice constant of the semiconductor material and that of the first semiconductor material SL1, i.e., lattice mismatch therebetween may be more than 1 percent. For example, when the first semiconductor layer SL1 includes silicon (Si), the second semiconductor layer SL1 may include germanium (Ge) but is not limited thereto.

In some embodiments, the second semiconductor layer SL2 may include a first region SL2a filling the recess region R and covering top surfaces of the capping blocking patterns DL2 and a second region SL2b on the first region SL2a. The second semiconductor layer SL2 may be substantially single-crystal. In this specification, "substantially single-crystal" means that there is substantially no grain boundary and crystal orientations are identical to each other. Substantially, single crystal means a virtually corresponding layer or portion although there is locally a grain boundary or there is a portion of different orientations. For example, a substantially single-crystal layer may include a plurality of low angle grain boundaries. The semiconductor device 1 may be formed according to the flowchart in FIG. 4.

Insulating mask patterns DL1 may be formed on a first semiconductor layer SL1 (S10). The insulating mask patterns DL1 may be formed by forming an insulating mask layer on the first semiconductor layer SL1 and performing a patterning process. The insulating mask layer may include oxide, nitride or oxynitride and may be formed by means of chemical vapor deposition (CVD). The patterning process may include forming a mask pattern (not shown) on an insulating mask layer and performing an anisotropic etch process using the mask pattern as an etch mask. Each of the insulating mask patterns DL1 may have a cylinder shape but is not limited thereto. Each of the insulating mask patterns DL1 may have a polygonal pillar shape. The insulating mask patterns DL1 may be formed on the first semiconductor layer SL1 to be arranged in the form of a closed packed honeycomb.

A recess region R may be formed in the first semiconductor layer SL1 to define protrusions P (S20). More specifically, the recess region R may be formed by performing an anisotropic etch process using the mask patterns DL1 as an etch mask on a resultant structure where the insulating mask patterns DL1 are formed. The protrusions P defined by the recess region R may have an arrangement form of a closed packed honeycomb. The protrusions P may have substantially the same arrangement form and sectional shape as the insulating mask patterns DL1.

Capping blocking patterns DL2 may be formed on the protrusions P (S30). The capping blocking patterns DL2 may cover top surfaces of the insulating mask patterns DL1 and extend into the recess region R. The capping blocking patterns DL2 may expose the first semiconductor layer SL1. The capping blocking patterns DL2 may be formed by forming a capping blocking layer on the entire surface of a resultant structure where the insulating mask patterns DL1 and the protrusions P are formed and performing an anisotropic etch process to remove a capping blocking layer on a bottom surface of the recess region R. A capping blocking layer on the insulating mask patterns DL1 may be formed to be thicker than a capping blocking layer in the recess region R. Thus, the capping blocking layer on the insulating mask patterns DL1 may remain although the capping blocking layer on the bottom surface of the recess region R is etched to expose the first semiconductor layer SL1. As a result, dislocation blocking patterns DP including the insulating mask patterns DL1 and the capping blocking patterns DL2 may be formed. The capping blocking layer may include oxide, nitride or oxynitride and may be formed by means of CVD.

The dislocation blocking patterns DP may be formed to have constant height H1 and constant width W1 with respect to a distance S1 between the dislocation blocking patterns DP, as explained above.

A second semiconductor layer SL2 may be formed on the first semiconductor layer SL1 to fill the recess region R and cover the dislocation blocking patterns DP. The second semiconductor layer SL2 may include a first region SL2a filling the recess region R and covering top surfaces of the capping blocking patterns DL2 and a second region SL2b on the first region SL2a.

The first region SL2a of the second semiconductor layer SL2 may be formed by means of a selective epitaxial growth process using the first semiconductor layer SL1 exposed between the dislocation blocking patterns DP as a seed layer (S40). In the early stage of growth, the first region SL2a grows only on the first semiconductor layer SL1 in the recess region R. However, as the growth is in progress, the first region SL2a may laterally overgrow to cover top surfaces of the capping blocking patterns DL2.

An annealing process may be performed (S50). The annealing process may be performed under the condition of a temperature less than a melting point of the second semiconductor layer SL2. For example, when the second semiconductor layer SL2 includes germanium (Ge), the annealing process may be performed under hydrogen ($H_2$) ambient at a temperature between 750 and 900 degrees centigrade. Due to the annealing process, a top surface of the first region SL2a may be planarized and a crystal defect in the first region SL2a may be further reduced. Thereafter, a second region SL2b of the second semiconductor layer SL2 may be formed. The second region SL2b may be formed by means of an epitaxial growth process using the first region SL2a of the second semiconductor layer SL2 as a seed layer (S60). The second region SL2b may be planarized by means of chemical mechanical polishing (CMP). The second semiconductor layer SL2 may substantially grow into single crystal.

As shown in FIG. 3, the second semiconductor layer SL2 may encounter threading dislocation (TD) in the recess region R due to a difference in lattice constant between the first and second semiconductor layers SL1 and SL2. This crystal defect mainly causes photoelectric conversion efficiency to be reduced. However, in case of the semiconductor device 1, dislocation blocking patterns DP are arranged in the recess region R of the first semiconductor layer SL1 in the form of a closed packed honeycomb to effectively block threading dislocation arising in the early growth of the second semiconductor layer SL2. As a result, the second semiconductor layer SL2 overgrowing on the dislocation blocking patterns DP may have a much lower threading dislocation density than the second semiconductor layer SL2 in the recess region R. That is, a threading dislocation density of the second region SL2b of the second semiconductor layer SL2 disposed in the higher level than top surfaces of the dislocation blocking patterns DP may be much smaller than that of the first region SL2a.

Figure 5:
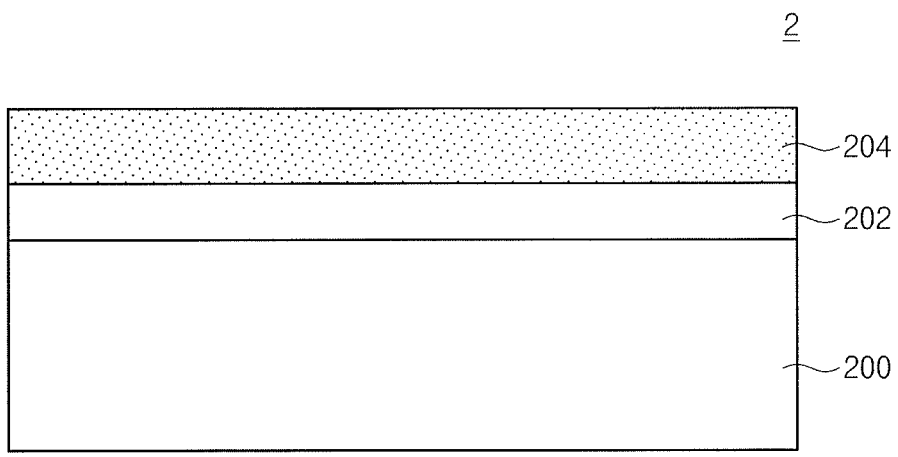
FIG. 5 is a cross-sectional view of a semiconductor device according to another embodiment.

FIG. 5 is a cross-sectional view of a semiconductor device 2 according to another embodiment. As illustrated in FIG. 5, the semiconductor device 2 may include an insulating layer 202 and a semiconductor layer 204 that are sequentially stacked on a substrate 200. That is, the semiconductor device 2 relates to a wafer including a semiconductor-on-insulating (SOI). The semiconductor substrate 200 may be a silicon substrate but is not limited thereto. The insulating layer 202 may include oxide. The semiconductor layer 204 may include a IV group semiconductor material or a III-V group compound semiconductor material. For example, the semiconductor layer 204 may include germanium (Ge). When the semiconductor layer 204 includes germanium, the semiconductor device 2 may be a germanium-on-insulator type wafer.

The semiconductor layer 204 may include a semiconductor layer explained with reference to FIGS. 1 to 4. That is, the semiconductor layer 204 may be a structure where a portion of the second region SL2b of the second semiconductor layer SL2 explained with reference to FIGS. 1 to 4 is formed on the substrate 200 by a smart cut technique.

A method of fabricating the semiconductor device 2 will now be described in detail with reference to FIGS. 1 to 5. An insulating layer may be formed on the second semiconductor layer SL2 of the semiconductor device 1. For example, the insulating layer may be formed by performing a thermal oxidation process to oxidize the second region SL2b of the second semiconductor layer SL2 to a constant thickness. Thereafter, an ion implantation process may be performed such that hydrogen is implanted deeper than thickness of a thermal oxide layer to separate the second semiconductor layer SL2 of the constant thickness.

A bonding process may be performed to bond the ion-implanted semiconductor device 1 to the substrate 200. The bonded semiconductor device 1 may be annealed at a high temperature to separate the second semiconductor layer SL2 into which hydrogen ions are implanted. A chemical mechanical polishing (CMP) process may be performed to polish a surface of the separated second semiconductor layer SL2. Thus, the fabrication of the semiconductor device 2 may be completed. The insulating layer on the second semiconductor layer SL2 of the semiconductor device 1 may be formed as an insulating layer 202 of the semiconductor device 2, and the separated second semiconductor layer SL2 of the semiconductor device 1 may be formed as a semiconductor layer 204 of the semiconductor device 2.

A semiconductor-on-insulator may be formed using the second semiconductor layer SL2 formed by the method described with reference to FIGS. 1 to 4, fabricating a semiconductor device 2 including a semiconductor layer with a minimized crystal defect (e.g., threading dislocation).

The semiconductor device 1 may include various structures including a junction between heterogeneous semiconductor layers. For example, the semiconductor device 1 may be a portion of an optical detector. A material of the first and second semiconductor layers SL1 and SL2 may vary depending on the kind of the semiconductor device 1. Hereinafter, an embodiment in which the semiconductor device 1 is an optical detector will be described but is not limited thereto.

Figure 6:
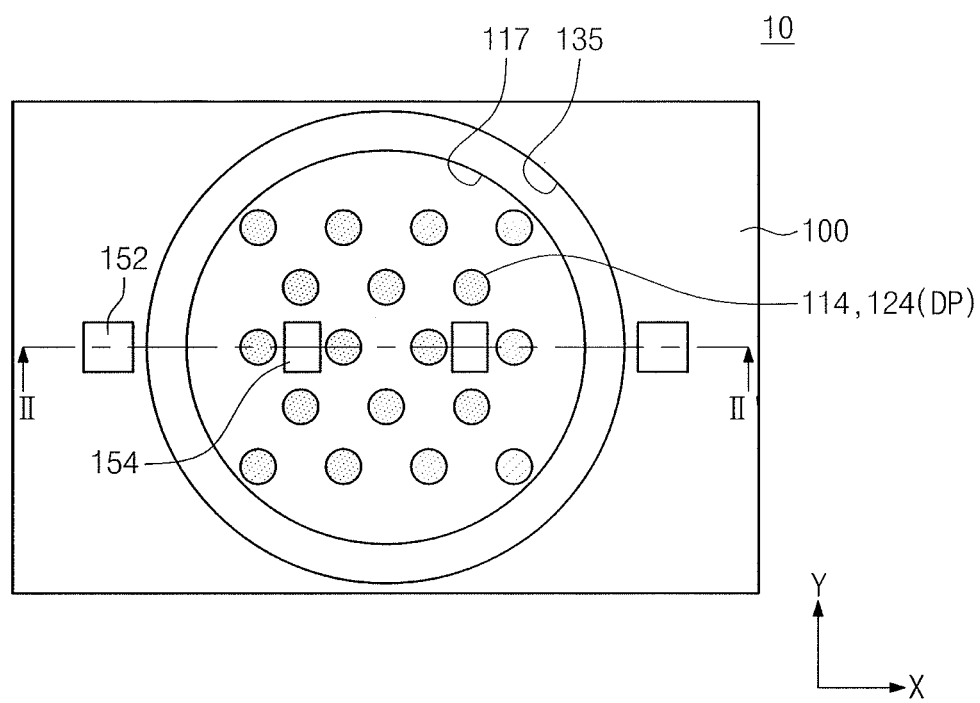
FIG. 6 is a plan view of an optical detector according to an embodiment.

FIG. 6 is a plan view of an optical detector according to an embodiment. FIGS. 7 to 15 are cross-sectional views taken along the line II-II' in FIG. 6, which illustrate an optical detector according to an embodiment and a method of fabricating the same.

Figure 7:
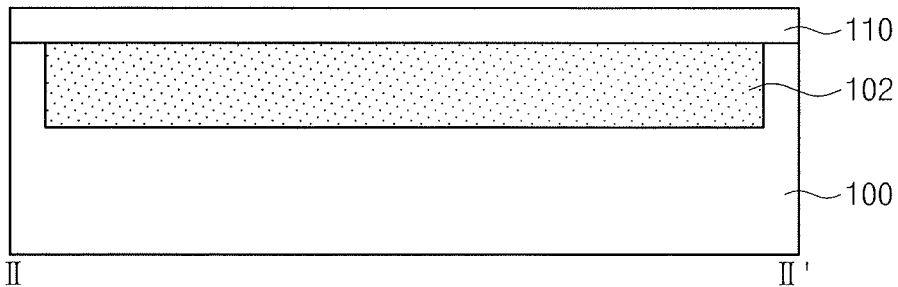
FIGS. 7 to 15 are cross-sectional views taken along the line II-II' in FIG. 6, which illustrate an optical detector according to an embodiment and a method of fabricating the optical detector.

Referring to FIGS. 6 and 7, a first conductive region 102 may be formed on a substrate 100.

The substrate 100 may be a semiconductor substrate or a semiconductor-based structure. For example, the substrate 100 may be a silicon substrate. Impurities of first conductivity type may be implanted into the substrate 100. The first conductivity type may be an n-type or a p-type. The impurities of the first conductivity type may be doped into a surface portion of the substrate 100 through an ion implantation process, and the doped impurities may be diffused to form the first conductive region 102 on a surface of the substrate 100.

An insulating mask layer 110 may be formed on the substrate 100 where the first conductive region 102 is formed. The insulating mask layer 110 may include silicon oxide, silicon nitride, silicon oxynitride or metal nitride. The insulating mask layer 110 may be formed by means of chemical vapor deposition (CVD) or physical vapor deposition (PVD).

Figure 8:
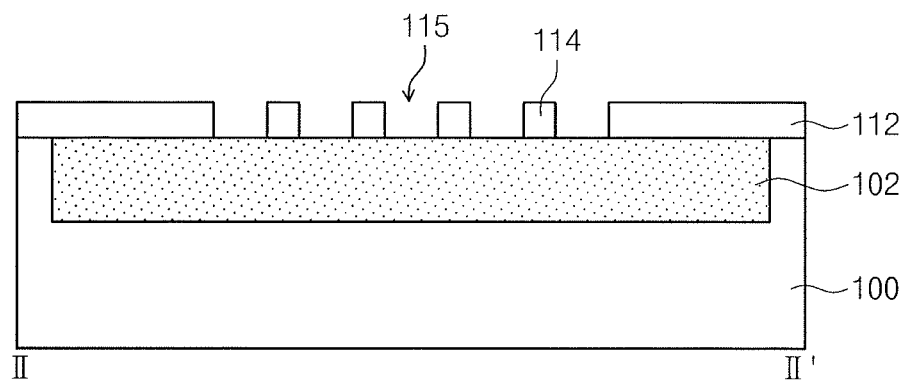

Referring to FIGS. 6 and 8, a first insulating mask pattern 112 and a plurality of second insulating mask patterns 114 may be formed on the substrate 100.

The first and second mask patterns 112 and 114 may be formed by forming a mask pattern (not shown) on the insulating mask layer 110 and performing an anisotropic etch process using the mask pattern as an etch mask.

The first insulating mask pattern 112 may have a first opening 115 to expose the first conductive region 102, and the second insulating mask patterns 114 may be disposed on the first conductive region 102 in the first opening 115. The second insulating mask patterns 114 may have a cylinder shape but is not limited thereto. The second insulating mask patterns 114 may have a polygonal pillar shape.

The second insulating mask patterns 114 may include a first group of second insulating mask patterns 114 spaced apart from each other in a first direction (x-direction) to constitute a row and a second group of second insulating mask patterns 114 spaced apart from the first group in a second direction (y-direction) intersecting the x-direction. The second group of second insulating mask patterns 114 may be spaced apart from each other in the x-direction to constitute a row and may be disposed to be shifted from the first group of second insulating mask patterns 114 in the x-direction. The shifted distance may be half a pitch between the first group of second insulating mask patterns 114. That is, when viewed in a plan view, the second insulating mask patterns 114 may be disposed to constitute a plurality of rows and columns, and second insulating mask patterns 114 of adjacent rows may be arranged in a zigzag form (i.e., arranged to form an offset) in one direction. Accordingly, the second insulating mask patterns 114 may be arranged in the form of a closed packed honeycomb in the first opening 115.

Figure 9:
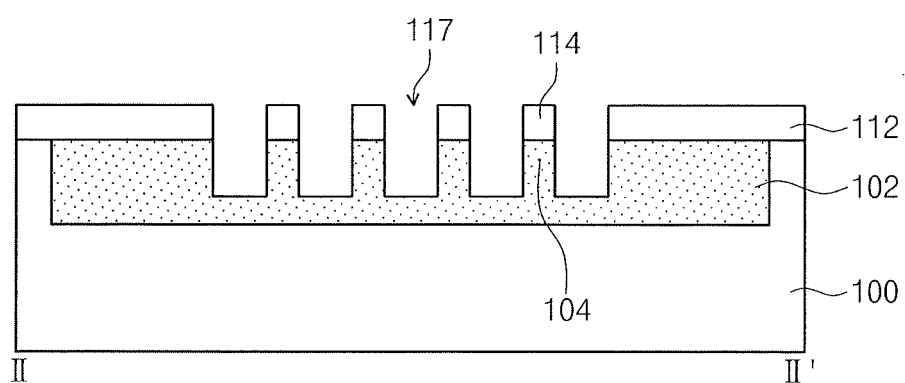

Referring to FIGS. 6 and 9, the first conductive region (102) exposed between the first and second insulating mask patterns 112 and 114 may be removed to form a recess region 117 in which the first opening 115 (see FIG. 8) extend into the substrate 100.

In an embodiment, the recess region 117 may be formed by performing an anisotropic etch process on a resultant structure where the first and second insulating mask patterns 112 and 114 are formed. The etch process may use a mask pattern (not shown) during formation of the first and second insulating mask patterns 112 and 114 as an etch mask. In some embodiments, an etch process for forming the recess region 117 may be performed in-situ with an etch process for forming the first and second insulating mask patterns 112 and 114. In this case, a bottom surface of the recess region 117 may have a higher level than that of the first conductive region 102.

As a result of formation of the recess region 117, protrusions 104 defined by the recess region 117 may be formed on the substrate 100. The protrusions 104 may have the same shape as the second insulating mask patterns 114 and may be arranged the same as the second insulating mask patterns 114 in the recess region 117.

Figure 10:
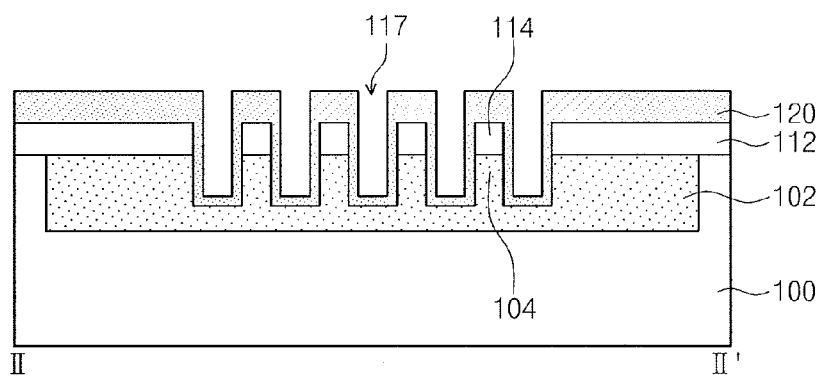

Referring to FIGS. 6 and 10, a capping blocking layer 120 may be formed on a resultant structure of FIG. 9.

In an embodiment, the capping blocking layer 120 may cover top surfaces of the first and second insulating mask patterns 112 and 114 and extend into the recess region 117. The capping blocking layer 120 may be non-conformally formed. That is, thickness of the capping blocking layer 120 formed on the top surface of the first and second insulating mask patterns 112 and 114 may be greater than that of the capping blocking layer 120 formed in the recess region 117.

The capping blocking layer 120 may include a material capable of block threading dislocation which arises during formation of an optical absorption layer 140 (see FIG. 14) that will be explained later. The material of the capping blocking layer 120 may have an etch selectivity with respect to an interlayer dielectric 130 (see FIG. 12) that will be explained later. For example, the capping blocking layer 120 may include silicon nitride, silicon oxynitride or metal nitride. Thus, the capping blocking layer 120 may be formed of the same material as the first and second insulating mask patterns 112 and 114 or may be formed of a different material than the first and second insulating mask patterns 112 and 114. The capping blocking layer 120 may be formed by means of chemical vapor deposition (CVD) or physical vapor deposition (PVD).

Figure 11:
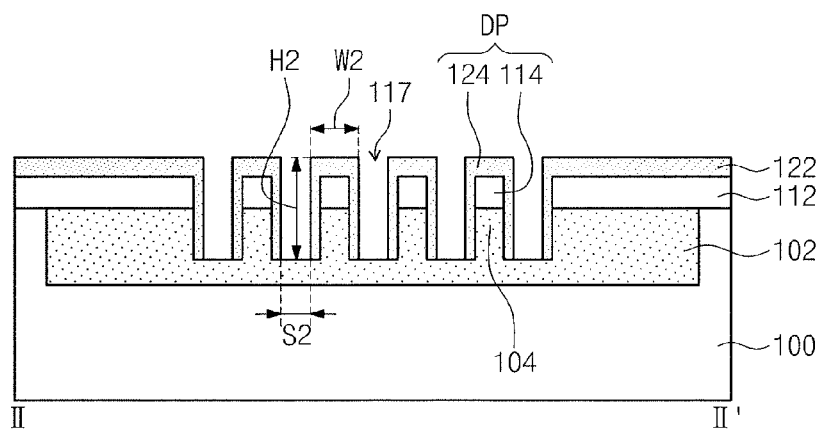

Referring to FIGS. 6 and 11, the capping blocking layer 120 (see FIG. 10) formed on a bottom surface of the recess region 117 may be removed to form a first capping blocking pattern 122 and second capping blocking patterns 124.

In an embodiment, the first and second capping blocking patterns 122 and 124 may be formed by performing an anisotropic etch process on a resultant structure where the capping blocking layer 120 (see FIG. 10) is formed. Since the thickness of the capping blocking layer 120 (see FIG. 10) on the top surfaces of the first and second insulating mask patterns 112 and 114 is greater than that of the capping blocking layer 120 (see FIG. 10) in the recess region 117, the capping blocking layer 120 (see FIG. 10) on the top surfaces of the first and second insulating mask patterns 112 and 114 may remain although the capping insulating layer 120 (see FIG. 10) on the bottom surface of the recess region 117 is etched to expose the first conductive region 102. As a result, dislocation blocking patterns DP including the second insulating mask patterns 114 and the second capping blocking patterns 124 may be formed.

The dislocation blocking patterns DP may be formed such that height H2 and width W2 of the dislocation blocking patterns DP may have a constant ratio with respect to a distance S2 between the dislocation blocking patterns DP. That is, in order to block threading dislocation during formation of an optical absorption layer 140 (see FIG. 14) that will be explained later, the dislocation blocking patterns DP may be formed such that an aspect ratio of the height H2 of the dislocation blocking pattern DP to the distance S2 between the dislocation blocking patterns DP is at least greater than 1. For example, a ratio of the height H2 of the dislocation blocking pattern DP to the distance S2 between the dislocation blocking patterns DP may be between 1:1.1 and 1:4.4. In this case, a ratio of the width W2 of the dislocation blocking pattern DP to the distance S2 between the dislocation blocking patterns DP may be between 1:0.25 and 1:2.

Figure 12:
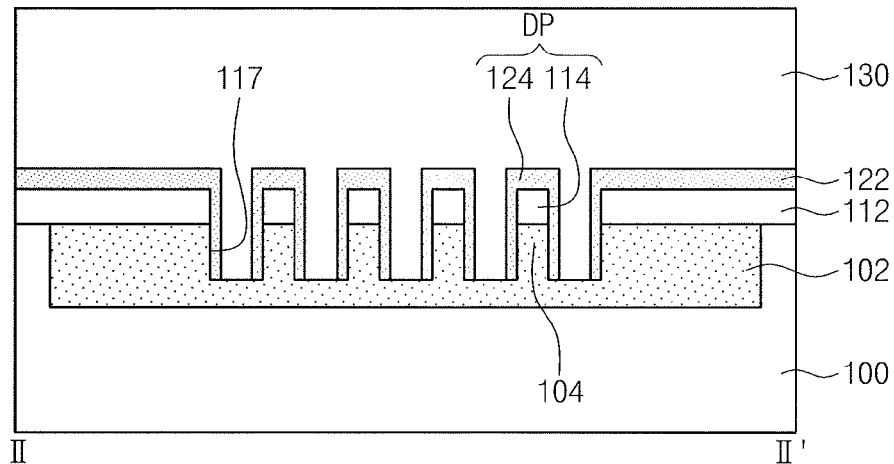

Referring to FIGS. 6 and 12, the interlayer dielectric 130 may be formed to fill the recess region 117 in which the first and second capping blocking patterns 122 and 124 are formed and to cover the entire surface of the substrate 100. The interlayer dielectric 130 may include a material having an etch selectivity with respect to the first and second capping blocking patterns 122 and 124. For example, the interlayer dielectric 130 may include silicon oxide. The interlayer dielectric 130 may be formed using a chemical vapor deposition (CVD) process.

Figure 13:
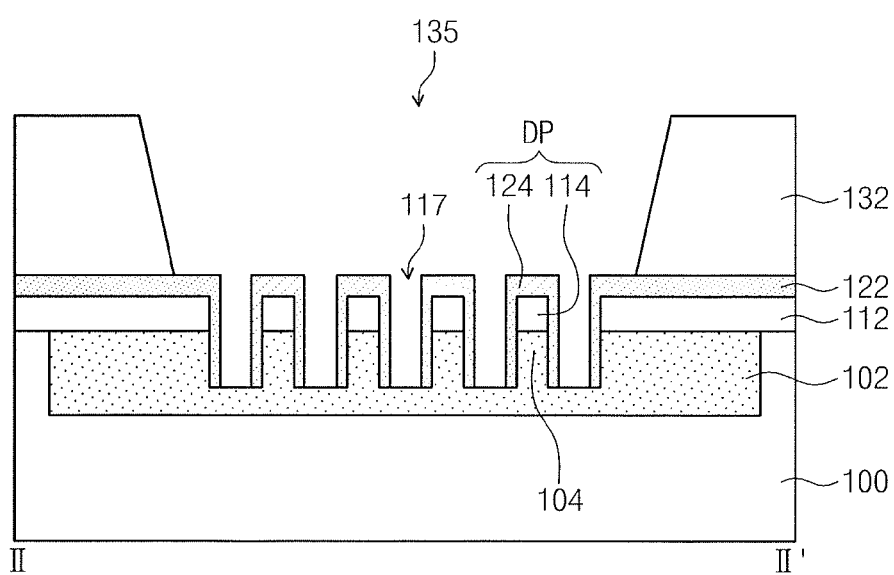

Referring to FIGS. 6 and 13, an interlayer dielectric pattern 132 may be formed on the capping blocking pattern 122. The interlayer dielectric pattern 132 has a second opening 135 to expose the dislocation blocking patterns DP.

In an embodiment, the interlayer dielectric pattern 132 may be formed by forming a mask pattern on the interlayer dielectric 130 and performing a dry etch and/or a wet etch using the mask pattern as an etch mask. As a result of the etch process, the interlayer dielectric 130 filling the recess region 117 may be removed to expose the first conductive region 102.

In some embodiments, the interlayer dielectric pattern 132 may have a sloped inner sidewall. That is, the second opening 135 of the interlayer dielectric pattern 132 may have substantially downwardly decreasing width. In other embodiments, an inner sidewall of the interlayer dielectric pattern 132 may have a perpendicular plane. Thus, the second opening 135 of the interlayer dielectric pattern 132 may have upper and lower widths that are substantially equal to each other.

Figure 14:
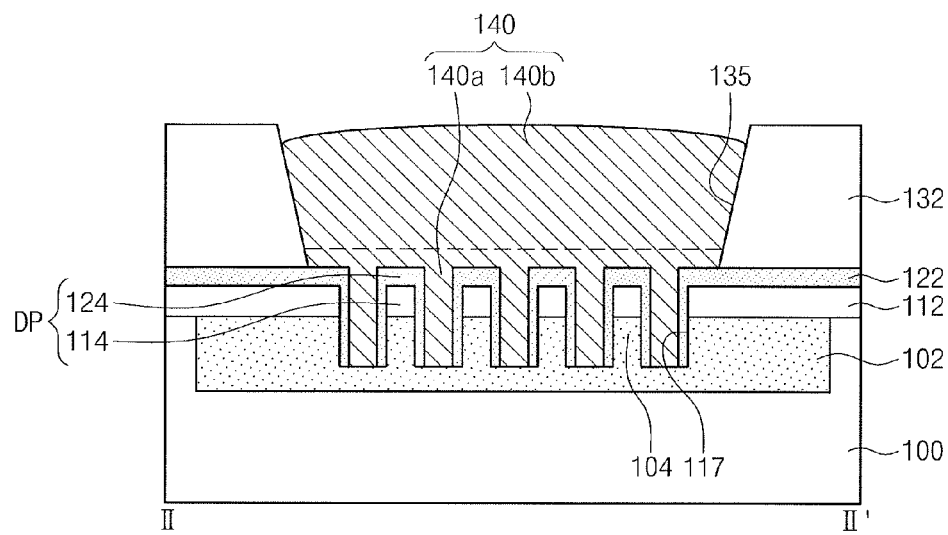

Referring to FIGS. 6 and 14, an optical absorption layer 140 may be formed to fill the recess region 117 and the second opening 135. The optical absorption layer 140 may include a first region 140a filling the recess region 117 and covering top surfaces of the capping blocking patterns 122 and 124 and a second region 140b on the first region 140a.

In an embodiment, the first region 140a of the optical absorption layer 140 may be formed using a selective epitaxial growth process with the first conductive region 102 exposed in the recess region 117 as a seed layer. In the early stage of growth, the first region 140a may be formed only on the first conductive region 102 in the recess region 117. However, as the growth is in progress, the first region 140a may laterally overgrow to cover the top surfaces of the capping blocking patterns 122 and 124. Thereafter, an annealing process may be performed. The annealing process may be performed under the condition of a temperature less than a melting point of the optical absorption layer 140. For example, when the optical absorption layer 140 includes germanium, the annealing process may be performed at a temperature between 750 and 900 degrees centigrade under a hydrogen ($H_2$) ambient. Due to the annealing process, a top surface of the first region 140a may be planarized and a crystal defect in the first region 140a may be further reduced. The second region 140b of the optical absorption layer 140 may be formed to fill the second opening 135. The second region 140b may be formed by means of an epitaxial growth process using the first region 140a as a seed layer. The optical absorption layer 140 may growth into single crystal. For example, the optical absorption layer 140 may be formed by molecular beam epitaxy (MBE), vapor phase epitaxy (VPE) or liquid phase epitaxy (LPE). In some embodiments, the optical absorption layer 140 may include germanium (Ge). When the optical absorption layer 140 include germanium, $GeH_4$, $Ge_2H_6$, $GeH_2Cl_2$, $GeCl_4$, $Ge_2Cl_6$ or the like may be used as a precursor for forming the optical absorption layer 140.

When germanium epitaxially grows directly on single-crystal silicon, a crystal defect may naturally result from a difference in lattice constant between the silicon and the germanium. The crystal defect mainly causes photoelectric conversion efficiency to be reduced. However, according to an embodiment, dislocation blocking patterns DP arranged in the form of a closed packed honeycomb may be formed in the recess region 117. Thus, threading dislocation arising in the early growth of the germanium may be effectively blocked by the dislocation blocking patterns DP. As a result, a laterally overgrowing germanium layer in the second opening 135 may have a much lower threading dislocation density than a germanium layer in the recess region 117. That is, threading dislocation density of the second region 140b of the optical absorption layer 140 may be much lower than that of the first region 140a.

Figure 15:
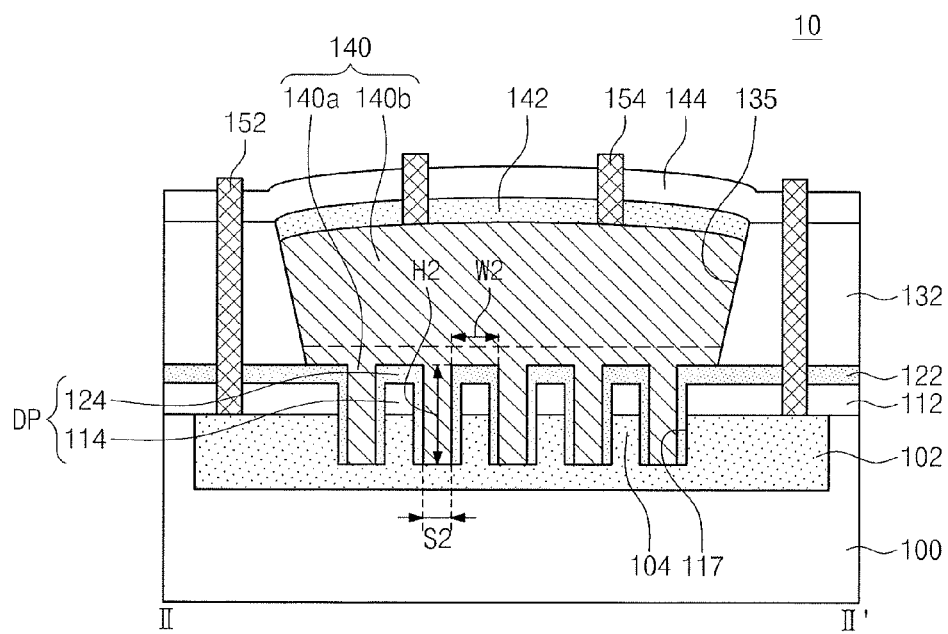

Referring to FIGS. 6 and 15, a second conductive layer 142 may be formed on the optical absorption layer 140.

In an embodiment, the second conductive pattern 142 may be formed using a selective epitaxial growth process with the optical absorption layer 140 as a seed layer. The second conductive pattern 142 may include a homogeneous or heterogeneous semiconductor material from the optical absorption layer 140. In some embodiments, the second conductive pattern 142 may be a germanium layer into which impurities of a second conductivity type differing from a first conductivity type are implanted. In other embodiments, the second conductive pattern 142 may be a silicon layer including impurities of the second conductivity type or a silicon-germanium layer. Impurities maybe implanted after formation of the second conductive pattern 142 or may be doped in-situ during formation of the second conductive pattern 142. A process of forming the optical absorption 140 and the second conductive pattern 142 explained in FIGS. 14 and 15 may be performed in-situ inside substantially the same chamber.

A protection layer 144 may be conformally formed on the interlayer dielectric pattern 132 and the second conductive pattern 142. The protection layer 144 may be continuously formed along an upper profile of the interlayer dielectric pattern 132 and the second conductive pattern 142. The protection layer 144 may include silicon oxide, silicon nitride or silicon oxynitride.

Continuing to refer to FIGS. 6 and 15, first and second connection terminals 152 and 154 may be formed to be electrically connected to the first conductive region 102 and the second conductive pattern 142, respectively. The first connection terminals 152 may be electrically connected to the first conductive region 102 through the protection layer 144, the interlayer dielectric pattern 132, the first capping blocking pattern 122, and the first insulating mask pattern 112. The second connection terminals 154 may be electrically connected to the second conductive pattern 142 through the protection layer 144. Although two first connection terminals 152 and two second connection terminals 154 are shown in this embodiment, the number of the first and second connection terminals 152 and 154 is not limited. Each of the first and second connection terminals 152 and 154 may include metal or metal compound.

An optical detector 10 according to an embodiment will now be described with reference to FIGS. 6 and 15.

The optical detector 10 may include dislocation blocking patterns DP on a substrate 100. The substrate 100 may be a semiconductor substrate or a semiconductor-based structure. For example, the substrate 100 may be a silicon substrate. The substrate 100 may include a first conductive region 102. The first conductive region 102 may be a region into which impurities of a first conductivity type are implanted. The first conductive type may be an n-type or a p-type.

The substrate 100 may have a recess region 117 and protrusions 104 defined by the recess region 117. The recess region 117 and the protrusions 104 may be portions formed by patterning the first conductive region 102. Each of the protrusions 104 may have, for example, a cylinder shape or a polygonal pillar shape.

The protrusions 104 may include a first group of protrusions 104 spaced apart from each other in a first direction (hereinafter referred to "x-direction") to constitute a row and a second group of protrusions 104 spaced apart from the first group in a second direction (hereinafter referred to as "y-direction") intersecting the x-direction. The second group of protrusions 104 may be spaced apart from each other in the x-direction to constitute a row and may be disposed to be shifted from the first group of protrusions 104 in the x-direction. The shifted distance may be half a pitch between the first group of protrusions 104. That is, when viewed in a plan view, the protrusions 104 may be disposed to constitute a plurality of rows and columns, and protrusions of adjacent rows may be arranged in a zigzag form in one direction. Accordingly, the protrusions 104 may be arranged in the form of a closed packed honeycomb.

A first insulating mask pattern 112 and a first capping blocking pattern 122 may be sequentially provided on the substrate 100 other than the recess region 117. The first insulating mask pattern 112 may expose the recess region 117 and the protrusions 104. The first capping blocking pattern 122 may cover an upper portion of the first insulating mask pattern 112 and extend to an inner sidewall of the first insulating mask pattern 112 and an inner sidewall of the recess region 117. The first insulating mask pattern 112 may include silicon oxide, silicon nitride, silicon oxynitride or metal nitride. In some embodiments, the first capping blocking pattern 122 may be formed of the same material as the first insulating mask pattern 122. For example, when the first insulating mask pattern 112 includes silicon nitride, silicon oxynitride or metal nitride, the first capping blocking pattern 122 may include the same material as the first insulating mask pattern 112. In other embodiments, the first capping blocking pattern 122 may be formed of a different material than the first insulating mask pattern 112. For example, when the first insulating mask pattern 112 includes silicon oxide, the first capping blocking pattern 122 may include silicon nitride, silicon oxynitride or metal nitride which is different from that of the first insulating mask pattern 112.

Second insulating mask patterns 114 and second capping blocking patterns 124 may be provided on the protrusions 104. The second insulating mask patterns 114 may have the same shape as the protrusions 104 and may have the same arrangement as the protrusions 104. The second capping blocking patterns 124 may cover upper portions of the second insulating mask patterns 114 and extend to outer sidewalls of the second insulating mask patterns 114 and outer sidewalls of the protrusions 104. The second insulating mask patterns 114 and the second capping blocking patterns 124 may have the same materials as the first insulating mask pattern 112 and the second capping blocking patterns 124, respectively. The second insulating mask patterns 114 and the second capping blocking patterns 124 may constitute dislocation blocking patterns DP. As a result, the optical detector 10 may include dislocation blocking patterns DP arranged on the recess region 117 of the substrate 100 in the form of a closed packed honeycomb.

The dislocation blocking patterns DP may have constant height H2 and constant width W2 with respect to a distance S2 between the dislocation blocking patterns DP. That is, an aspect ratio of the height H2 of the dislocation blocking pattern DP to the distance S2 between the dislocation blocking patterns DP may be at least greater than 1 to prevent threading dislocation (TD) in the early stage of formation of the optical absorption layer 140. For example, a ratio of the height H2 of the dislocation blocking pattern DP to the distance S2 between the dislocation blocking patterns DP may be between 1:1.1 and 1:4.4. In an embodiment, a ratio of the width W2 of the dislocation blocking pattern DP to the distance S2 between the dislocation blocking patterns DP may be between 1:0.25 and 1:2.

An interlayer dielectric pattern 132 may be disposed on the first capping blocking patterns 122. The interlayer dielectric pattern 132 may include a material having an etch selectivity with respect to the first and second capping blocking patterns 122 and 124. For example, the interlayer dielectric 132 may include silicon oxide.

The interlayer dielectric pattern 132 may have a second opening 135 to expose the recess region 117 and the dislocation blocking patterns DP. When viewed in a plan view, the second opening 135 of the interlayer dielectric pattern 132 may have a larger area than the recess region 117 of the substrate 100. The second opening 135 is cylindrical in FIG. 6 but is not limited thereto. In some embodiments, the interlayer dielectric pattern 132 may have a sloped inner sidewall. That is, the second opening 135 of the interlayer dielectric pattern 132 may have substantially downwardly decreasing width. In other embodiments, an inner sidewall of the interlayer dielectric pattern 132 may have a perpendicular plane. Thus, the second opening 135 of the interlayer dielectric pattern 132 may have upper and lower widths that are substantially equal to each other.

An optical absorption layer 140 may be disposed on the dislocation blocking patterns DP to fill the second opening 135 of the interlayer dielectric pattern 132. The optical absorption layer 140 may include a first region 140a to fill the recess region 117 and cover top surfaces of the dislocation blocking patterns DP and a second region 140b on the first region 140a. The optical absorption layer 140 may include a IV group semiconductor material or a III-V group compound semiconductor material having a lattice constant difference of 1 percent or greater from the substrate 100. For example, the optical absorption layer 140 may include germanium. The optical absorption layer 140 may be in a substantially undoped, (i.e., intrinsic) state.

Due to the difference in lattice constant between the substrate 100 and the optical absorption layer 140, a crystal defect may naturally occur in the optical absorption layer 140. In this embodiment, the optical absorption layer 140 in the recess region 117 and the optical absorption layer 140 to fill the second opening 135 may be different in threading dislocation density. That is, the threading dislocation density of the second region 140b of the optical absorption layer 140 disposed at the higher level than the dislocation blocking patterns DP may be much lower than that of the first region 140a. This is because the dislocation blocking patterns DP in the recess region 117 are arranged in the form of a closed packed honeycomb and thus threading dislocation occurring at the optical absorption layer 140 in the recess region 117 may be effectively blocked by the dislocation blocking patterns DP. As set forth above, the materials of the substrate 100 and the optical absorption layer 140 constituting the optical detector 10 are silicon and germanium, respectively. However, the materials of the substrate 100 and the optical absorption layer 140 are not limited thereto and may be variously changed.

A second conductive pattern 142 may be disposed on the optical absorption layer 140. The second conductive pattern 142 may include a homogeneous or heterogeneous semiconductor material with the optical absorption layer 140. In some embodiments, the second conductive pattern 142 may be a germanium layer into which impurities of a second conductivity type differing from a first conductivity type are implanted. In other embodiments, the second conductive pattern 142 may be a silicon layer containing impurities of a second conductivity type or a silicon-germanium layer.

A protection layer 144 may be provided on the interlayer dielectric pattern 132 and the second conductive pattern 142. The protection layer 144 may include silicon oxide, silicon nitride or silicon oxynitride. First and second connection terminals 152 and 154 may be formed to be electrically connected to the first conductive region 102 and the second conductive pattern 142, respectively. The first connection terminals 152 may be electrically connected to the first conductive region 102 through the protection layer 144, the interlayer dielectric pattern 132, the first capping blocking pattern 122, and the first insulating mask pattern 112. The second connection terminals 154 may be electrically connected to the second conductive pattern 142 through the protection layer 144. Although two first connection terminals 152 and two second connection terminals 154 are shown in this embodiment, the number of the first and second connection terminals 152 and 154 is not limited. Each of the first and second connection terminals 152 and 154 may include metal or metal compound.

According to an embodiment, a density of lattice defect such as dislocation in the optical absorption layer 140 provided in the second opening 135 may be significantly reduced. As a result, noise increase caused by leakage current and signal attenuation caused by increase in recombination center of charges may be reduced to improve reactivity and sensitivity of the optical detector 10.

The optical detector 10 may have an uneven structure including a recess region 117 below the optical absorption layer 140 and protrusions defined by the recess region 117 to enhance optical coupling efficiency.

Figure 16:
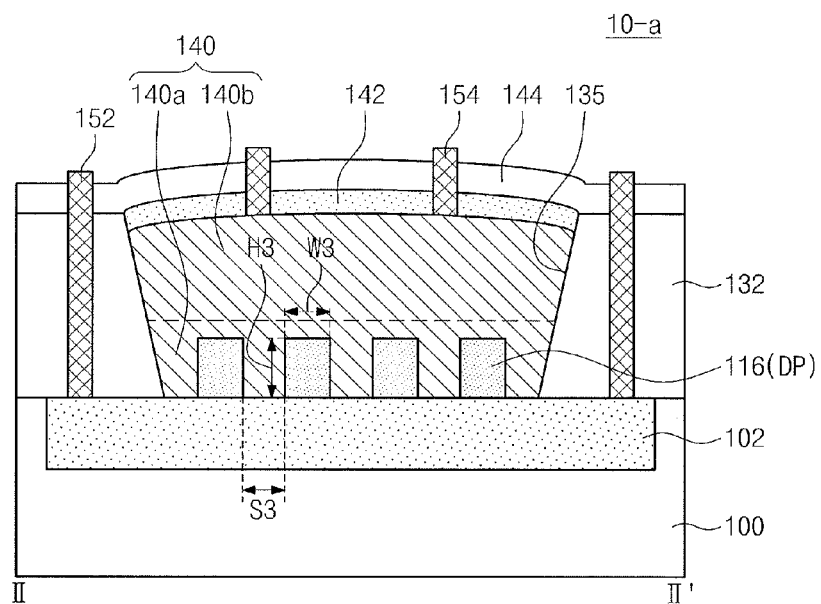
FIG. 16 is a cross-sectional view of an optical detector according to another embodiment.

FIG. 16 is a cross-sectional view of an optical detector 16-a according to another embodiment. For brevity of description, explanations of duplicate elements will be omitted. The optical detector 10-a in FIG. 16 may be substantially identical to the optical detector 10 in FIGS. 6 and 15, except that a the recess region in FIGS. 6 and 15 are not formed.

Referring to FIGS. 6 and 16, dislocation blocking patterns (DP) 116 may be disposed on a first conductive region 102 in a substrate 100. The dislocation blocking patterns (DP) 116 may have a cylinder shape but is not limited thereto. The dislocation blocking patterns (DP) 116 may have a polygonal pillar shape. Similar to the dislocation blocking patterns DP in FIG. 15, the dislocation blocking patterns (DP) 116 may be arranged on the first conductive region 102 in the form of a closed packed honeycomb. In addition, similar to the dislocation blocking patterns DP in FIG. 15, the dislocation blocking patterns (DP) 116 may have constant height H3 and constant width W3 with respect to a distance S3 between the dislocation blocking patterns (DP) 116. That is, an aspect ratio of the height H3 of the dislocation blocking pattern (DP) 116 to the distance S3 between the dislocation blocking patterns (DP) 116 may be at least greater than 1 to prevent threading dislocation (TD) in the early stage of formation of an optical detector 140. For example, a ratio of the height H3 of the dislocation blocking pattern (DP) 116 to the distance S3 between the dislocation blocking patterns (DP) 116 may be between 1:1.1 and 1:4.4. In this case, a ratio of the width W3 of the dislocation blocking pattern (DP) 116 to the distance S3 between the dislocation blocking patterns (DP) 116 may be between 1:0.25 and 1:2. The dislocation blocking patterns (DP) 116 may include the same material as the first and second capping blocking patterns 122 and 124 in FIG. 15.

An interlayer dielectric pattern 132 may be disposed on the substrate 100. The interlayer dielectric pattern 132 may have a second opening 135 to expose the dislocation blocking patterns (DP) 116 and the first conductive region 102. When viewed in a plan view, the second opening 135 of not limited thereto. The interlayer dielectric pattern 132 may include a material having an etch selectivity with respect to the dislocation blocking patterns (DP) 116. For example, the interlayer dielectric pattern 132 may include oxide.

An optical absorption layer 140 may be disposed on the first conductive region 102 to fill the second opening 135. The optical absorption layer 140 may include a first region 140a to fill a space between the dislocation blocking patterns (DP) 116 and a space between the dislocation blocking patterns (DP) 116 and the interlayer dielectric pattern 132, and a second region 140b on the first region 140a. In this case, the threading dislocation density of the second region 140b of the optical absorption layer 140 disposed at the higher level than the dislocation blocking patterns (DP) 116 may be much lower than that of the first region 140a. Similar as set forth in FIG. 15, this is because the dislocation blocking patterns (DP) 116 are arranged on the first conductive region 102 in the form of a closed packed honeycomb and thus threading dislocation occurring at the optical absorption layer 140 in the space between the dislocation blocking patterns (DP) 116 and the space between the dislocation blocking patterns (DP) 116 and the interlayer dielectric pattern 132 may be effectively blocked by the dislocation blocking patterns (DP) 116.

Figure 17:
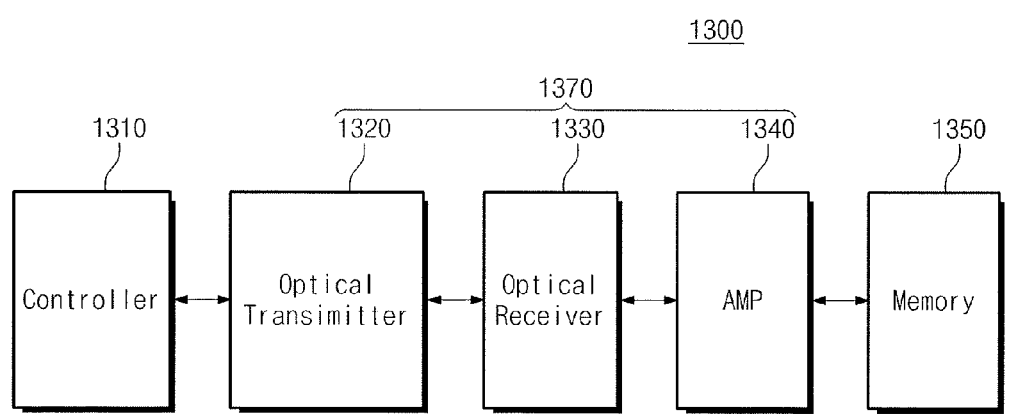
FIG. 17 illustrates an electronic device including an optical detector according to embodiments.

FIG. 17 illustrates an electronic device 1300 including an optical detector according to embodiments. Referring to FIG. 17, the electronic device 1300 may be one of a personal digital assistant (PDA), a laptop computer, a portable computer, a web tablet, a wireless phone, a cellular phone, a digital music player, a wired/wireless electronic device, and a complex electronic device including at least two thereof. The electronic device 1300 may include a controller 1310 and an optical interconnector 1370. The optical interconnector 1370 may include an optical transmitter 1320 to convert data transmitted from the controller 1310 into an optical signal and an optical receiver 1330 to convert the optical signal received from the optical transmitter 1320 into an electrical signal. An optical detector according to embodiments may constitute a part of the optical receiver 1330. A light emitting element according to embodiments may constitute a part of the optical transmitter 1320. A signal transmitted from the optical receiver 1330 may be amplified by an amplifier (AMP) 1340. The controller 1310 may include, for example, one or more microprocessors, a digital signal processor, a microcontroller or the like. The memory 1330 may be used to store a command executed by the controller 1310. The memory 1330 may be used to store user data.

The semiconductor devices disclosed in the above embodiments may be packaged as one of various types to be subsequently embedded. For example, semiconductor device according to embodiments may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

As described so far, a crystal defect of a semiconductor layer formed by epitaxial growth may be reduced. In addition, density of a lattice defect such as dislocation in an optical absorption layer may significantly decrease As a result, noise increase caused by leakage current and signal attenuation caused by increase in recombination center of charges may be reduced to improve reactivity and sensitivity of an optical detector. Moreover, a substrate below the optical absorption layer may have an uneven structure including a recess region below the optical absorption layer and protrusions defined by the recess region to enhance optical coupling efficiency.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. For example, it is possible to adjust the driving capability of a sub word line driver or adjust the slope of level of applied driving signals by changing, adding, or removing the circuit configuration or arrangement in the drawings without departing from the technical spirit of the present disclosure in other cases.

What is claimed is:

1. A semiconductor device comprising:
a first semiconductor layer including a recess region and protrusions defined by the recess region;
first insulating patterns provided on the protrusions and extending to sidewalls of the protrusions; and
a second semiconductor layer to fill the recess region and cover the first insulating patterns,
wherein the protrusions include:
a first group of protrusions spaced apart from each other in a first direction to constitute a first row, and
a second group of protrusions spaced from each other in the first direction to constitute a second row, the second group of protrusions being spaced from the first group of protrusions in a second direction intersecting the first direction, and
wherein protrusions in the second group of protrusions are shifted from respective protrusions in the first group of protrusions in the first direction.

2. The semiconductor device as set forth in claim 1, wherein:
the protrusions are arranged to constitute a plurality of rows and columns when viewed in a plan view, and
protrusions of adjacent first and second rows are arranged in a zigzag form along the first direction, the first insulating patterns on the protrusions being arranged in same first and second groups on the protrusions to define the zigzag form.

3. The semiconductor device as set forth in claim 1, wherein protrusions of adjacent first and second rows are offset in the first direction.

4. The semiconductor device as set forth in claim 1, wherein a height from a lowermost surface of the first insulating patterns to a top surface of the first insulating patterns is greater than a distance between first insulating patterns adjacent in the first direction.

5. The semiconductor device as set forth in claim 1, further comprising:
second insulating patterns provided between top surfaces of the protrusions and the first insulating patterns,
wherein the second insulating patterns include a different material than the first insulating patterns.

6. The semiconductor device as set forth in claim 1, wherein each of the protrusions has a pillar shape, and each of the first insulating patterns surrounds a top surface and a sidewall of each protrusion.

7. The semiconductor device as set forth in claim 1, wherein the second semiconductor layer includes a semiconductor material having a lattice constant difference of one (1) percent or greater from the first semiconductor layer.

8. The semiconductor device as set forth in claim 1, wherein the second semiconductor layer includes a first portion to fill the recess region and a second portion provided at a higher level than top surfaces of the first insulating patterns, and the second portion has a lower threading dislocation density than the first portion.

9. The semiconductor device as set forth in claim 1, wherein an annealing process is performed under hydrogen ($H_2$) ambient at a temperature between 750 degrees centigrade and 900 degrees centigrade.

10. A method of forming a semiconductor device, the method comprising:
forming a recess region in a first semiconductor layer to define protrusions;
forming first insulating patterns on the protrusions, the first insulating patterns extending to sidewalls of the protrusions; and
forming a second semiconductor layer to fill the recess region and cover the first insulating patterns,
wherein the protrusions include:
a first group of protrusions spaced apart from each other in a first direction to constitute a first row, and
a second group of protrusions spaced from each other in the first direction to constitute a second row, the second group of protrusions being spaced from the first group of protrusions in a second direction intersecting the first direction, and
wherein protrusions in the second group of protrusions are shifted from respective protrusions in the first group of protrusions in the first direction, and
wherein forming the second semiconductor layer includes:
forming a first region to fill the recess region and top surfaces of the first insulating patterns,
performing an annealing process after formation of the first region, and
forming a second region on the first region.

11. The method as set forth in claim 10, wherein the protrusions are arranged to constitute a plurality of rows and columns when viewed in a plan view, and
wherein the protrusions of adjacent first and second rows are arranged in a zigzag form along the first direction.

12. The method as set forth in claim 10, wherein protrusions of adjacent first and second rows are offset in the first direction.

13. The method as set forth in claim 10, wherein:
the first region is formed by performing a selective epitaxial growth process using the first semiconductor layer exposed between the first insulating patterns as a seed layer, and
the second region is formed by performing an epitaxial growth process using the first region as a seed layer.

14. The method as set forth in claim 10, further comprising:
forming second insulating patterns between top surfaces of the protrusions and the first insulating patterns,
wherein forming the recess region includes:
forming the second insulating patterns on the first semiconductor layer, and
performing an anisotropic etch process using the second insulating patterns as an etch mask, and
wherein the second insulating patterns include a different material than the first insulating patterns.

15. The method as set forth in claim 10, wherein the annealing process is performed under hydrogen ($H_2$) ambient at a temperature between 750 degrees centigrade and 900 degrees centigrade.

16. An optical detector, comprising:
a substrate;
an interlayer insulating pattern provided on the substrate and having an opening to expose the substrate;
first insulating patterns provided on the substrate in the opening; and
an optical absorption layer provided on the first insulating patterns and filling the opening, wherein the first insulating patterns includes:
- a first group of first insulating patterns spaced apart from each other in a first direction to constitute a first row, and
- a second group of first insulating patterns spaced from the first group of first insulating patterns in a second direction intersecting the first direction, and protrusions in the second group being spaced from each other in the first direction to constitute a second row, and wherein protrusions in the second group of first insulating patterns are shifted from protrusions in the first group of first insulating patterns in the first direction.

17. The optical detector as set forth in claim 16, wherein the first insulating patterns are arranged to constitute a plurality of rows and columns when viewed in a plan view, and wherein the first insulating patterns of adjacent first and second rows are arranged in a zigzag form along the first direction.

18. The semiconductor device as set forth in claim 16, wherein protrusions of adjacent first and second rows are offset in the first direction.

19. The optical detector as set forth in claim 16, wherein the substrate further comprises a recess region and protrusions defined by the recess region, and wherein the first insulating patterns are provided on the protrusions and extend to sidewalls of the protrusions.

* * * * *